US009344033B2

(12) United States Patent
Ito

(10) Patent No.: US 9,344,033 B2
(45) Date of Patent: May 17, 2016

(54) VARIABLE CAPACITANCE CIRCUIT, OSCILLATOR CIRCUIT, VIBRATORY DEVICE, ELECTRONIC APPARATUS, MOVING OBJECT, AND METHOD OF MANUFACTURING VIBRATORY DEVICE

(71) Applicant: Seiko Epson Corporation, Tokyo (JP)

(72) Inventor: Hisahiro Ito, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/298,350

(22) Filed: Jun. 6, 2014

(65) Prior Publication Data

US 2014/0361845 A1    Dec. 11, 2014

(30) Foreign Application Priority Data

Jun. 11, 2013 (JP) ................................ 2013-123126

(51) Int. Cl.
*H03B 1/00* (2006.01)
*H01G 7/06* (2006.01)

(52) U.S. Cl.
CPC .. *H03B 1/00* (2013.01); *H01G 7/06* (2013.01); *Y10T 29/49004* (2015.01)

(58) Field of Classification Search
CPC ........................................................ H03B 1/00
USPC .......... 331/154, 158, 176, 177 R, 177 V, 181, 331/182, 185, 186
See application file for complete search history.

(56) References Cited

U.S. PATENT DOCUMENTS

| 6,731,181 B2* | 5/2004 | Fukayama et al. ............ 331/176 |
| 7,170,358 B2 | 1/2007 | Tsukizawa et al. |
| 7,321,271 B2 | 1/2008 | Takinami et al. |
| 7,701,304 B2 | 4/2010 | Tsukizawa et al. |
| 8,013,682 B2* | 9/2011 | Hu et al. ......................... 331/16 |
| 2013/0038400 A1* | 2/2013 | Asamura ....................... 331/158 |

FOREIGN PATENT DOCUMENTS

| JP | 11-308050 A | 11/1999 |
| JP | 2003-258553 A | 9/2003 |
| JP | 2003-324316 A | 11/2003 |
| JP | 2004-147310 A | 5/2004 |
| JP | 2004-165799 A | 6/2004 |
| JP | 2006-033803 A | 2/2006 |
| JP | 2008-245259 A | 10/2008 |

* cited by examiner

*Primary Examiner* — Jeffrey Shin
(74) *Attorney, Agent, or Firm* — Harness, Dickey & Pierce, P.L.C.

(57) ABSTRACT

A variable capacitance circuit includes a plurality of variable capacitance elements (varicaps) each having the capacitance value controlled in accordance with the inter-terminal voltage applied between the terminals of the variable capacitance element and connected in parallel to each other, has the combined capacitance value of the plurality of variable capacitance elements variable taking a predetermined capacitance value as a base, sets the inter-terminal voltage of at least one of the plurality of variable capacitance elements to a first voltage as a variable voltage, and sets the inter-terminal voltage of the rest of the plurality of variable capacitance elements to a second voltage as a stationary voltage.

9 Claims, 7 Drawing Sheets

VARIABLE CAPACITANCE CIRCUIT, OSCILLATOR CIRCUIT, VIBRATORY DEVICE, ELECTRONIC APPARATUS, MOVING OBJECT, AND METHOD OF MANUFACTURING VIBRATORY DEVICE

BACKGROUND

1. Technical Field

The present invention relates to a variable capacitance circuit, an oscillator circuit, a vibratory device, an electronic apparatus, a moving object, a method of manufacturing a vibratory device, and so on.

2. Related Art

The variable capacitance circuit includes a variable capacitance element, and is capable of adjusting the capacitance value by varying a control voltage to be applied to the variable capacitance element. The variable capacitance element is, for example, a varicap (variable capacitance diode), and the varicap varies in capacitance value in accordance with an inter-terminal voltage (equal to a control voltage in the case in which one of the terminals is in the ground voltage). The variable capacitance circuit is used as a load capacitance of, for example, an oscillator circuit, and is used for adjusting the frequency (hereinafter also referred to as an oscillation frequency) of an oscillation signal in some cases.

For example, the invention disclosed in JP-A-2003-258553 (Document 1) includes the variable capacitance circuit in the oscillator circuit, and can suppresses the influence of the voltage fluctuation with respect to the oscillation frequency by switching a stationary voltage to be applied to each of the variable capacitance elements.

Here, when manufacturing the oscillator including, for example, an oscillator element, it is necessary to adjust the shift of the oscillation frequency based on the individual variation in the oscillator element to output a desired frequency. On this occasion, according to the oscillator circuit of Document 1, when switching the stationary voltage, the voltage-oscillation frequency characteristic varies significantly. Therefore, since the frequency variable range also varies significantly in some cases, a complicated adjustment becomes necessary in general, and it is unachievable to make it easy to adjust the oscillation frequency.

Further, a variable capacitance circuit used for the oscillator of JP-A-2003-324316 (Document 2) is for switching the voltage to be applied to the variable capacitance element between a stationary voltage and the power supply voltage to control the capacitance value of the variable capacitance to be the maximum value or the minimum value. However, since the voltage-oscillation frequency characteristic significantly varies due to the switching of the voltage (see, e.g., FIG. 2B of Document 2), and thus the frequency variable range also varies in some cases, it is unachievable to make it easy to adjust the oscillation frequency.

Here, among the variable capacitance circuits, there exist some circuits in which the variable capacitance element itself can be unconnected using a switch circuit. However, if the number of the variable capacitance elements to be unconnected is varied, the voltage-oscillation frequency characteristic also changes dramatically. Therefore, even by using such a variable capacitance circuit as described above as the load capacitance of the oscillator circuit, it is unachievable to make it easy to adjust the oscillation frequency.

On the contrary, it can be said that the complicated adjustment procedure is unnecessary if certain regularity exists in the change when switching the voltage-oscillation frequency. Further, if the oscillation frequency can be varied around a certain frequency (hereinafter also referred to as a specific frequency), the adjustment of the oscillation frequency can easily be executed.

SUMMARY

An advantage of some aspects of the invention is to provide a variable capacitance circuit, an oscillation circuit, a vibratory device, an electronic apparatus, a moving object, and a method of manufacturing a vibratory device each making it possible to easily adjust a value varying in accordance with the variation in the capacitance value such as an oscillation frequency.

The invention can be implemented as the following aspects or application examples.

Application Example 1

This application example is directed to a variable capacitance circuit including a plurality of variable capacitance elements each having a capacitance value controlled by an inter-terminal voltage applied between terminals of the variable capacitance element, and connected in parallel to each other, and a variable characteristic of a combined capacitance value of the plurality of variable capacitance elements becomes variable taking a predetermined capacitance value as a base.

According to the variable capacitance circuit of this application example, the variable characteristic (a variable range of the combined capacitance value, a variable sensitivity of the combined capacitance) of the combined capacitance value of the plurality of variable capacitance elements becomes variable taking the predetermined capacitance value (a reference capacitance value) as a base. Therefore, since the variable capacitance circuit according to this application example can obtain the reference capacitance value in the case of applying a certain inter-terminal voltage even if the variable range of the combined capacitance value is varied, the value varying with the variation in the capacitance value can easily be adjusted. For example, in the oscillator circuit including the variable capacitance circuit according to this application example, since the specific frequency is determined in accordance with the reference capacitance value, and the oscillation frequency can be varied centered on the specific frequency, the adjustment of the oscillation frequency becomes easy. Further, since the specific frequency is determined in accordance with the reference capacitance value, the oscillation frequency variable range (oscillation frequency variable sensitivity) can be adjusted centered on the specific frequency. Therefore, the adjustment of the oscillation frequency variable range becomes easy. Further, according to the variable capacitance circuit related to this application example, since the configuration having the plurality of variable capacitance elements connected in parallel to each other is adopted, it is possible to make the variable range of the combined capacitance and the number of the variable capacitance elements correspond to each other.

Here, the inter-terminal voltage of the variable capacitance element is a voltage applied between the terminals and to control the capacitance value. Further, the reference capacitance value is the capacitance value forming the base of the variable capacitance circuit, and is the capacitance value obtained when applying a certain inter-terminal voltage irrespective of the variation in the voltage-combined capacitance characteristic (see, e.g., FIG. 3).

Application Example 2

The variable capacitance circuit according to the application example described above may be configured such that the inter-terminal voltage of at least one of the plurality of variable capacitance elements is set to a first voltage as a variable voltage, and the inter-terminal voltage of the rest of the plurality of variable capacitance elements is set to a second voltage as a stationary voltage.

According to the variable capacitance circuit of this application example, the inter-terminal voltage of some of the plurality of variable capacitance elements is set to the first voltage, and the inter-terminal voltage of the rest of the plurality of variable capacitance elements is set to the second voltage. The first voltage is a variable voltage, and the second voltage is a stationary voltage. The variable capacitance element with the inter-terminal voltage set to the second voltage can be treated as a stationary capacitance with the capacitance value invariable even with the variation in the first voltage. Therefore, the adjustment amount of the combined capacitance value varies in accordance with how many variable capacitance elements among the plurality of variable capacitance elements have the inter-terminal voltage set to the first voltage. For example, in the case in which the data for designating how many variable capacitance elements have the inter-terminal voltage set to the first voltage is stored in a memory or the like, the change in adjustment amount of the combined capacitance value can be achieved by rewriting the data.

Here, the variable voltage denotes the voltage which can dynamically be changed, and the first voltage can be made to correspond to the control voltage described above. The stationary voltage denotes the voltage other than the variable voltage, and the second voltage is fixed to a certain voltage in at least the period in which a device or the like including the variable capacitance circuit is used.

Application Example 3

The variable capacitance circuit according to the application example described above may be configured such that the second voltage takes a voltage higher than a minimum voltage value of the variable voltage, and lower than a maximum voltage value of the variable voltage.

According to the variable capacitance circuit of this application example, the second voltage takes a voltage higher than the minimum voltage value of the variable voltage (the first voltage), and lower than the maximum voltage value of the variable voltage. The first voltage as the variable voltage can dynamically be varied between the minimum voltage value and the maximum voltage value, and the second voltage as the stationary voltage takes a certain voltage (e.g., the middle voltage) larger than the minimum voltage value and smaller than the maximum voltage value. On this occasion, it is possible to make the reference capacitance value correspond to a certain voltage higher than the minimum voltage value and lower than the maximum voltage value. Therefore, since the combined capacitance value of the variable capacitance circuit can be adjusted in both directions around the reference capacitance value using the first voltage, the oscillation frequency, for example, can be adjusted centered on the specific frequency corresponding to the reference capacitance value. Further, based on the fact described above, the adjustment of, for example, the oscillation frequency can easily be performed. Here, the minimum voltage value and the maximum voltage value can also be the lower limit voltage value and the upper limit voltage value determined in accordance with, for example, the specification of the variable capacitance element.

Application Example 4

The variable capacitance circuit according to the application example described above may be configured such that the predetermined capacitance value is the combined capacitance value obtained when setting the inter-terminal voltages of all of the plurality of variable capacitance elements to the second voltage.

According to the variable capacitance circuit of this application example, the reference capacitance value is the combined capacitance value obtained when setting the inter-terminal voltages of all of the variable capacitance elements to the second voltage. Therefore, when setting the first voltage as the variable voltage to be equal to the second voltage, the reference capacitance value can be obtained. Further, based on the fact described above, the adjustment of, for example, the oscillation frequency can easily be performed.

Application Example 5

The variable capacitance circuit according to the application example described above may be configured such that the variable capacitance circuit further includes a control section adapted to control the inter-terminal voltage of each of the plurality of variable capacitance elements to be set to one of the first voltage and the second voltage.

According to the variable capacitance circuit of this application example, whether the inter-terminal voltage is set to the first voltage or set to the second voltage can be changed by the control section. Therefore, since the adjustment amount of the combined capacitance can be varied by the control section, the adjustment of, for example, the oscillation frequency can easily and efficiently be performed.

Application Example 6

The variable capacitance circuit according to the application example described above may be configured such that the control section includes a switch adapted to exclusively select one of the first voltage and the second voltage.

According to the variable capacitance circuit of this application example, the control section can control whether the inter-terminal voltage is set to the first voltage or set to the second voltage using the switch. Therefore, the control section can control the inter-terminal voltage of each of the plurality of variable capacitance elements without requiring a complicated circuit.

Application Example 7

The variable capacitance circuit according to the application example described above may be configured such that a control section includes a storage section storing data for setting the inter-terminal voltage of each of the plurality of variable capacitance elements to one of the first voltage and the second voltage.

According to the variable capacitance circuit of this application example, the control section includes the storage section storing the data for setting the inter-terminal voltage to one of the first voltage and the second voltage. Therefore, the adjustment amount of the combined capacitance value can flexibly be varied by rewriting the data in the storage section.

Here, the storage section can be a nonvolatile memory such as a flash memory, or can be a volatile random access memory (RAM), or can be other memory devices.

Application Example 8

The variable capacitance circuit according to the application example described above may be configured such that the control section controls the inter-terminal voltage of each of the plurality of variable capacitance elements to be set to one of the first voltage and the second voltage based on a control signal input to the control section.

According to the variable capacitance circuit of this application example, whether the inter-terminal voltage is set to the first voltage or set to the second voltage can be changed by the control section based on the control signal from, for example, the outside of the variable capacitance circuit. Therefore, it is possible for the user or the like to change the adjustment amount of the combined capacitance value even after manufacturing the device or the like including the variable capacitance circuit of this application example. For example, it is possible to select an appropriate voltage-combined capacitance value characteristic (see, e.g., FIG. 3) using the control signal.

Application Example 9

This application example is directed to an oscillator circuit adapted to oscillate an oscillation section to generate an oscillation signal, and including the variable capacitance circuit according to any one of the application examples described above as a load capacitance.

According to the oscillator circuit of this application example, since the variable capacitance circuit according to any of the application examples described above is included as the load capacitance, the oscillation frequency can easily be adjusted. Here, the oscillation section can also be an oscillator element such as a quartz crystal resonator, or MEMS or tuning-fork quartz crystal resonator, or can be composed of electronic components such as an RC circuit or an LC circuit.

Application Example 10

This application example is directed to a vibratory device including the oscillator circuit according to the application example described above, and the oscillation section.

According to the vibratory device of this application example, since the variable capacitance circuit according to any of the application examples described above is included as the load capacitance in the oscillator circuit, the oscillation frequency can easily be adjusted.

Application Example 11

This application example is directed to an electronic apparatus including the variable capacitance circuit according to the application example described above.

Application Example 12

This application example is directed to a moving object including the variable capacitance circuit according to the application example described above.

According to the electronic apparatus and the moving object of the application examples, since the variable capacitance circuit according to any one of the application examples described above is included as the load capacitance, the value (e.g., the oscillation frequency) varying in accordance with the variation in the capacitance value can easily be adjusted.

Application Example 13

This application example is directed to a method of manufacturing a vibratory device including an oscillation section, a variable capacitance circuit including a plurality of variable capacitance elements each having a capacitance value controlled by an inter-terminal voltage applied between terminals of the variable capacitance element, and connected in parallel to each other, setting the inter-terminal voltage of at least one of the plurality of variable capacitance elements to a first voltage as a variable voltage while setting the inter-terminal voltage of the other of the plurality of variable capacitance elements to a second voltage as a stationary voltage, and making a variable characteristic of a combined capacitance value of the plurality of variable capacitance elements variable taking a predetermined capacitance value as a base, a control section adapted to control the inter-terminal voltage of each of the plurality of variable capacitance elements to be set to one of the first voltage and the second voltage, and an oscillator circuit having the variable capacitance circuit electrically connected to the oscillator circuit, and adapted to oscillate the oscillation section to generate an oscillation signal. The method includes measuring a frequency of the oscillation signal with the first voltage varied, comparing a reference frequency and the frequency measured in the measuring with each other, and controlling, by the control section, the inter-terminal voltage based on a result in the comparing.

According to the method of manufacturing the vibratory device of this application example, since the measuring, the comparing, and the adjusting are included, the oscillation frequency can easily be adjusted while appropriately varying the adjustment amount of the combined capacitance value.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a preferred embodiment of the invention will be described in detail with reference to the accompanying drawings. It should be noted that the embodiment described below does not unreasonably limit the contents of the invention as set forth in the appended claims. Further, all of the constituents described below are not necessarily essential elements of the invention.

Figure 1:
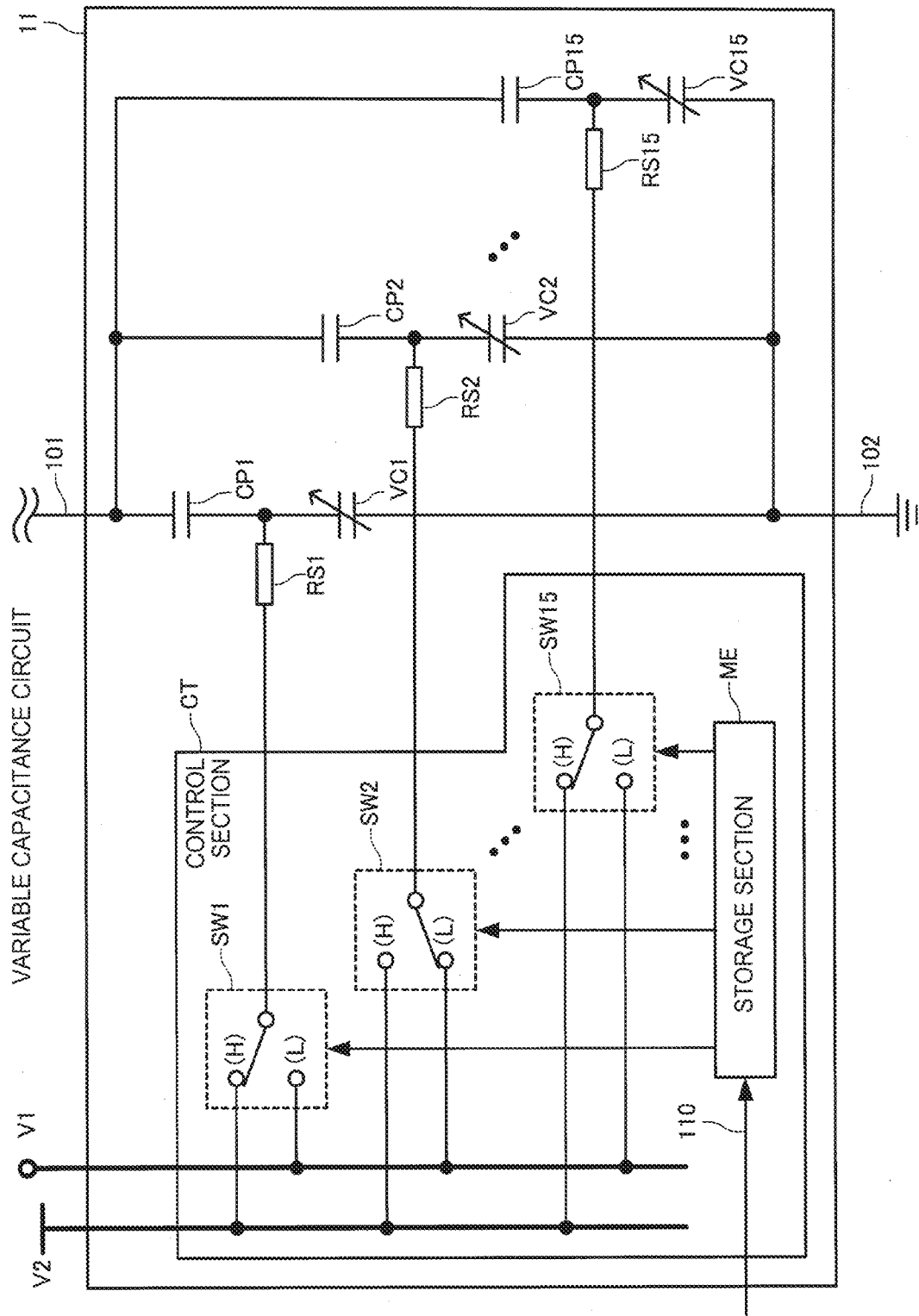
FIG. 1 is a diagram showing a configuration example of a variable capacitance circuit according to the embodiment.

1. Variable Capacitance Circuit and Oscillator Circuit Configuration of Variable Capacitance Circuit FIG. 1 is a diagram showing a configuration example of a variable capacitance circuit 11 according to the present embodiment. The variable capacitance circuit 11 constitutes a part of an oscillator circuit 10 described later, and is specifically used as an adjustable load capacitance (see FIG. 2).

The variable capacitance circuit 11 includes a plurality of varicaps VC1, VC2, ..., and VC15 (corresponding to the variable capacitance elements according to the invention) and a control section CT. The varicaps VC1, VC2, ..., and VC15 are connected in parallel to each other as shown in FIG. 1, and the respective capacitance values can be controlled by the control section CT. It should be noted that although the variable capacitance circuit 11 according to the present embodiment includes fifteen varicaps VC1, VC2, ..., and VC15, the number of the varicaps is not limited to fifteen, and the larger the number is, the higher the resolution can be increased in the adjustment of the oscillation frequency described later.

Although hereinafter the varicaps VC1, VC2, ..., and VC15 will be explained in detail, only the varicap VC1 will be explained for avoiding redundant explanations. Further, it is assumed that the same as the varicap VC1 applies to the varicaps VC2, ..., and VC15 unless otherwise noted. It should be noted that although in the variable capacitance circuit 11 according to the present embodiment, varicaps of the same type (those the same in the center value and the variable range of the capacitance) are used as the varicaps VC1, VC2, ..., and VC15, some or all of the varicaps can be configured using those of the types different in the center value and the variable range of the capacitance value.

The varicap VC1 varies in capacitance value with the variation in the inter-terminal voltage to be applied between the terminals. One (hereinafter referred to as a first terminal) of the terminals of the varicap VC1 is connected to a signal line 102, and has the ground voltage in the present embodiment. It should be noted that the voltage level of the first terminal is not limited to the ground level.

The other (hereinafter referred to as a second terminal) of the terminals of the varicap VC1 is provided with a voltage (a first voltage V1 or a second voltage V2 described later) from the control section CT via a resistor RS1. In the present embodiment, the capacitance of the varicap VC1 increases when the inter-terminal voltage drops, and the capacitance of the varicap VC1 decreases when the inter-terminal voltage rises. Therefore, the capacitance value of the varicap VC1 can be controlled by the control section CT.

Here, the second terminal of the varicap VC1 is also connected to a signal line 101 via a stationary capacitance CP1. In the present embodiment, the signal line 101 is connected to a quartz crystal resonator 26 in the oscillator circuit 10 (see FIG. 2), and the stationary capacitance CP1 is disposed for cutting the direct-current component.

The variable capacitance circuit 11 has the configuration of connecting the varicaps VC1, VC2, ..., and VC15 having such a configuration in parallel to each other. Specifically, the first terminal of each of the varicaps VC2, ..., and VC15 is also connected to the signal line 102. Further, the second terminals of the varicaps VC2, ..., and VC15 are connected to stationary capacitances CP2, ..., and CP15 and resistors RS2, ..., and RS15, respectively. Terminals (terminals not connected to the varicaps VC2, ..., and VC15) on the opposite side to the stationary capacitances CP2, ..., and CP15 are also connected to the signal line 101. It should be noted that all of the first terminals of the varicaps VC2, ..., and VC15 are not required to be connected to the same signal line 102 to thereby have the same voltage level, and some or all of the first terminals of the varicaps VC2, ..., and VC15 can also have voltage levels different from each other.

Then, the control section CT will be explained. The control section CT applies voltages to the respective second terminals of the varicaps VC1, VC2, ..., and VC15 via respective resistors RS1, RS2, ..., and RS15. In the present embodiment, the voltages to be applied are either of a first voltage V1 and a second voltage V2.

Here, the first voltage V1 is a variable voltage, and the second voltage V2 is a stationary voltage. The voltage no lower than the minimum voltage value Vmin with which the capacitance value of each of the varicaps VC1, VC2, ..., and VC15 becomes the minimum and no higher than the maximum voltage value Vmax with which the capacitance value of each of the varicaps VC1, VC2, ..., and VC15 becomes the maximum can be applied to the second terminal of each of the varicaps VC1, VC2, ..., and VC15. On this occasion, the first voltage V1 varies in the range of the minimum voltage value Vmin through the maximum voltage value Vmax, while the second voltage V2 is fixed to a certain voltage in the range of the minimum voltage value Vmin through the maximum voltage value Vmax. In other words, it results that among the varicaps VC1, VC2, ..., and VC15, those applied with the second voltage V2 by the control section CT each have the stationary capacitance value without being affected by the variation in the first voltage V1.

The control section CT includes switches SW1, SW2, ..., and SW15 for selecting the voltages to be applied to the second terminals of the varicaps VC1, VC2, ..., and VC15, respectively. Each of the switches SW1, SW2, ..., and SW15 can be configured using, for example, a transmission gate, but is not limited to a specific configuration. Here, the explanation will be explained assuming that the switches SW1, SW2, ..., and SW15 each select the first voltage V1 when the respective select signals are in the low level (L), and select the second voltage V2 when the respective select signals are in the high level (H).

The switches SW1, SW2, ..., and SW15 select one of the first voltage V1 and the second voltage V2 independently of each other. In the example shown in FIG. 1, the switches SW1 and SW15 select the second voltage V2, and the switch SW2 selects the first voltage V1. On this occasion, it results that although the varicap VC2 varies in capacitance value in accordance with the variation in the first voltage V1, the varicap VC1 and the varicap VC15 have the stationary capacitance value without being affected by the variation in the first voltage V1.

The control section CT includes a storage section ME for storing the signal levels of the respective select signals of the switches SW1, SW2, ..., and SW15. In the present embodiment, the bits of 15-bit data (hereinafter referred to as setting data) of the storage section ME correspond to the voltage levels of the select signals of the switches SW1, SW2, ..., and SW15, respectively. For example, in the case in which the n-th bit (n is an integer in a range of 1 through 15) of the setting data is "0," the select signal corresponding to that bit becomes in the low level (L), and in the case in which the n-th bit is "1," the select signal corresponding to that bit becomes in the high level (H). In addition, it is assumed that the storage section ME of the variable capacitance circuit 11 according to the present embodiment includes at least a flash memory, and the setting data is stored in the flash memory.

Further, the setting data of the storage section ME can be changed in accordance with a control signal 110 input from the outside of the variable capacitance circuit 11. Specifically, when using the variable capacitance circuit 11, the first voltage V1 can be varied in the range of the minimum voltage value Vmin through the maximum voltage value Vmax, and in addition, it is also possible to change which one of the first voltage V1 and the second voltage V2 is applied to each of the varicaps VC1, VC2, ..., and VC15. Although the details will be described later, the variable capacitance circuit 11 according to the present embodiment is capable of changing the adjustment amount of the combined capacitance value at the point of use, and can therefore accurately adjust, for example, the oscillation frequency to a desired frequency. Here, the point of use of the variable capacitance circuit 11 denotes the point of use of, for example, an oscillator and an electronic apparatus including the variable capacitance circuit 11. Therefore, the adjustment amount of the combined capacitance value can be changed even after manufacturing the variable capacitance circuit 11.

Configuration of Oscillator Circuit

Figure 2:
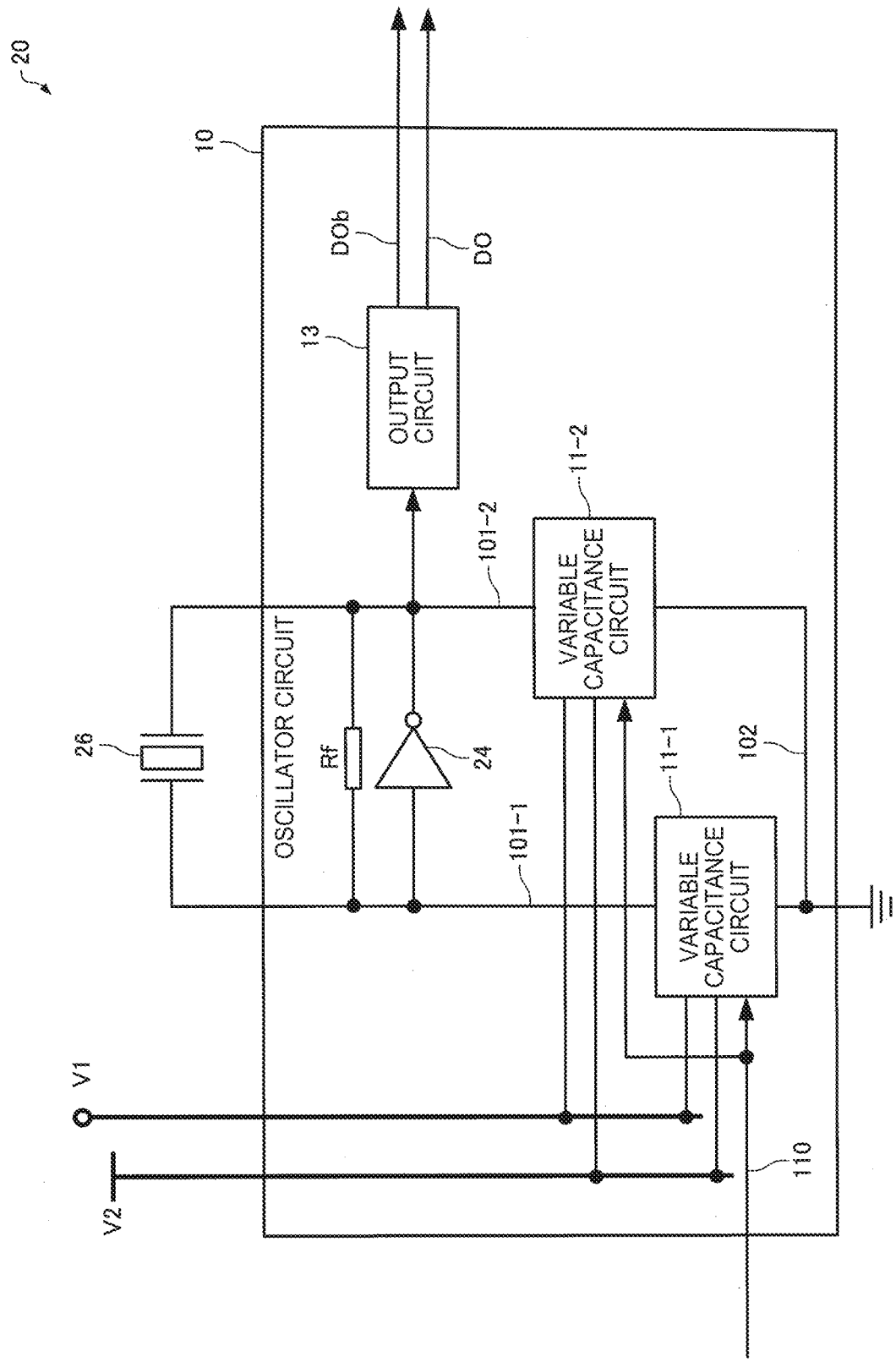
FIG. 2 is a diagram for explaining an oscillator circuit including the variable capacitance circuit according to the embodiment as a load capacitance.

FIG. 2 is a diagram for explaining the oscillator circuit 10 including the variable capacitance circuit 11 according to the present embodiment. It should be noted that the same elements as those shown in FIG. 1 are denoted with the same reference symbols, and the explanation thereof will be omitted.

As shown in FIG. 2, the oscillator circuit 10 is connected to the quartz crystal resonator 26 (corresponding to an oscillation section according to the invention), oscillates the quartz crystal resonator 26 to generate an oscillation signal, then convert the oscillation signal into differential signals to output a non-inverted output signal DO, and an inverted output signal DOb. In other words, the oscillator circuit 10 is connected to the quartz crystal resonator 26 to constitute a quartz crystal oscillator 20 on which temperature compensation or the like is not performed, namely a simple packaged quartz crystal oscillator (SPXO). Here, the oscillator circuit 10 can also be a semiconductor integrated circuit (IC) formed as a single chip.

Here, the variable capacitance circuit 11 is included in the oscillator circuit 10 as an adjustable load capacitance. In the example shown in FIG. 2, the oscillator circuit 10 includes an inverter 24 provided with a feedback resistor Rf functioning as an analog amplifier, and two variable capacitance circuits 11-1, 11-2. Further, as shown in FIG. 2, the oscillator circuit 10 is connected to the quartz crystal resonator 26 to form an oscillation loop. Further, the oscillator circuit 10 includes an output circuit 13, and converts the oscillation signal into the differential signals and then outputs the differential signals. The output circuit 13 can be, for example, a positive emitter coupled logic (PECL), a low voltage PECL (LVPECL), or the like, but is not particularly limited and can perform single-end output.

Here, although the variable capacitance circuit 11-1 and the variable capacitance circuit 11-2 have the same configuration, the signal line 101-1 of the variable capacitance circuit 11-1 is connected to an input-terminal side of the inverter 24 of the oscillator circuit 10, and the signal line 101-2 of the variable capacitance circuit 11-2 is connected to an output-terminal side of the inverter 24. It should be noted that the control signal 110, the first voltage V1, the second voltage V2, and the signal line 102 are common to the variable capacitance circuits 11-1, 11-2. It should be noted that there can be adopted a configuration in which only either one of the variable capacitance circuits 11-1, 11-2 is included in the oscillator circuit 10. Further, in the variable capacitance circuits 11-1, 11-2, the control signal 110, the first voltage V1, the second voltage V2, and the signal line 102 are not required to be common to the variable capacitance circuits 11-1, 11-2, but can be different between the variable capacitance circuits. Further, there can be adopted a configuration in which only either one of the variable capacitance circuits 11-1, 11-2 is included in the oscillator circuit 10, and is disposed between the quartz crystal resonator 26 and the inverter 24.

Although the oscillator circuit 10 is required to output the oscillation signal with a desired frequency, the oscillation frequency varies due to, for example, the individual difference of the quartz crystal resonator 26 to be connected in some cases. Therefore, the oscillator circuit 10 is often provided with a function of capable of adjusting the load capacitance so that the desired frequency can be obtained.

For example, the invention of Document 2 is also capable of adjusting the oscillation frequency by changing the control voltage (corresponding to the first voltage V1 of the variable capacitance circuit 11 according to the present embodiment). However, the voltage-oscillation frequency characteristic dramatically varies (see FIG. 2B of Document 2) in accordance with the setting of the switch (steps S8 through S11 in FIG. 2A of Document 2), it is difficult to figure out the variation in the characteristic, and as a result, the adjustment procedure of the oscillation frequency becomes complicated, and the adjustment time is also required.

However, in the variable capacitance circuit 11 according to the present embodiment, the combined capacitance value of the varicaps VC1, VC2, . . . , and VC15 inevitably varies taking a predetermined capacitance value (a reference capacitance value) as the base irrespective of how the switches SW1, SW2, . . . , and SW15 are set. Therefore, the voltage-oscillation frequency characteristic varies in gradient centered on a specific frequency (an oscillation frequency based on the reference capacitance value) with respect to the oscillation signal of the oscillator circuit 10. Since the voltage-oscillation frequency characteristic has such regularity, the oscillator circuit 10 can easily adjust the oscillation frequency. Here, in the variable capacitance circuit 11, if the first voltage V1 as the variable voltage is set to the second voltage V2, the combined capacitance value of the varicaps VC1, VC2, . . . , and VC15 becomes the reference capacitance value irrespective of the setting of the switches SW1, SW2, . . . , and SW15. Therefore, by setting the first voltage V1 to be equal to the second voltage V2, the specific frequency can be obtained also in the oscillator circuit 10.

Combined Capacitance Value of Variable Capacitance Circuit

The variation in the combined capacitance value of the varicaps VC1, VC2, . . . , and VC15 of the variable capacitance circuit 11 according to the present embodiment and the voltage-oscillation frequency characteristic thereof will hereinafter be explained with reference to FIGS. 3 and 4. It should be noted that the same elements as those shown in FIGS. 1 and 2 are denoted with the same reference symbols, and the explanation thereof will be omitted.

Figure 3:
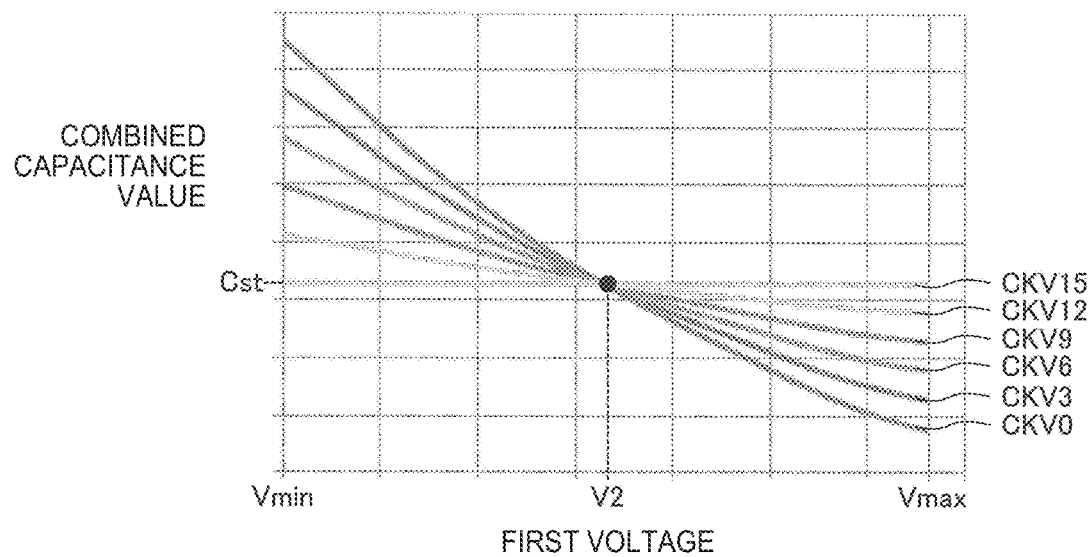
FIG. 3 is a diagram for explaining a relationship between a first voltage and a combined capacitance value.

FIG. 3 is a diagram for explaining the relationship between the first voltage V1 and the combined capacitance value of the variable capacitance circuit 11 according to the present embodiment. The horizontal axis represents the first voltage V1, and the vertical axis represents the combined capacitance value. The first voltage V1 is variable in the range from the minimum voltage Vmin to the maximum value Vmax. Here, the voltage V2 in FIG. 3 is equal to the second voltage V2. For example, the second voltage V2 can also be the middle voltage between Vmin and Vmax, namely a stationary voltage represented by (Vmin+Vmax)/2. On this occasion, it is possible to make the canter value of the combined capacitance value of the varicaps VC1, VC2, . . . , and VC15 correspond to the reference capacitance value. Further, the symbol Cst in FIG. 3 is the predetermined capacitance value (the reference capacitance value).

Here, although the combined capacitance value of the varicaps VC1, VC2, . . . , and VC15 of the variable capacitance circuit 11 according to the present embodiment varies in accordance with the value of the first voltage V1, the characteristic curve (the voltage-combined capacitance characteristic) corresponds to CKVn (n=0, 3, 6, 9, 12, and 15) shown in FIG. 3. Here, the number n included in the name of the characteristic curve represents how many varicaps are provided with the second voltage V2 among the fifteen varicaps VC1, VC2, ..., and VC15. As described above, it results that among the varicaps VC1, VC2, ..., and VC15, those applied with the second voltage V2 by the control section CT each have the stationary capacitance value without being affected by the variation in the first voltage V1. Therefore, the number n included in the name of the characteristic curve represents the number of the varicaps treated as the stationary capacitance among the fifteen varicaps VC1, VC2, ..., and VC15.

For example, in CKV15 of FIG. 3, since the capacitance values of the fifteen varicaps VC1, VC2, ..., and VC15 are not affected by the variation in the first voltage V1, the combined capacitance value is kept in the reference capacitance value Cst. Further, for example, in CKV0 of FIG. 3, all of the capacitance values of the fifteen varicaps VC1, VC2, ..., and VC15 vary in accordance with the value of the first voltage V1. Therefore, the variation in the combined capacitance value becomes the largest. However, in also CKV0 shown in FIG. 3, in the case in which the first voltage V1 is set to V2, the combined capacitance value becomes the reference capacitance value Cst. This also applies to CKV3, CKV6, CKV9, and CKV12 shown in FIG. 3.

Specifically, the combined capacitance value of the variable capacitance circuit 11 according to the present embodiment varies inevitably including the reference capacitance value Cst irrespective of how the switches SW1, SW2, ..., and SW15 are set. Further, in the case in which the first voltage V1 is set to V2, the combined capacitance value of the variable capacitance circuit 11 according to the present embodiment becomes the reference capacitance value Cst. It should be noted that although CKVn (n=1, 2, 4, 5, 7, 8, 10, 11, 13, 14) are omitted from display in FIG. 3 for the sake of convenience of graphical description, these characteristic curves also vary inevitably including the reference capacitance value Cst.

Figure 4:
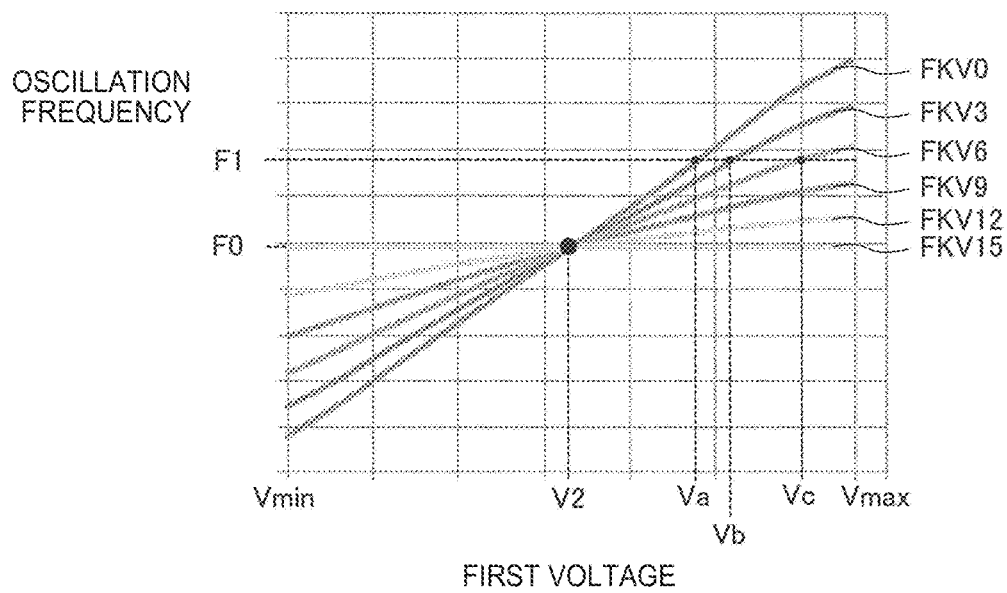
FIG. 4 is a diagram for explaining a relationship between the first voltage and an oscillation frequency.

FIG. 4 is a diagram for explaining the relationship between the first voltage V1 of the variable capacitance circuit 11 according to the present embodiment and the oscillation frequency output from the oscillator circuit 10 including the variable capacitance circuit 11. It should be noted that the same elements as those shown in FIG. 3 are denoted with the same reference symbols, and the explanation thereof will be omitted. In FIG. 4, the horizontal axis represents the first voltage V1, and the vertical axis represents the oscillation frequency. The symbol F0 in FIG. 4 is an oscillation frequency corresponding to the case in which the first voltage V1 is set to V2, namely the reference capacitance value Cst. If the frequency F0 is the desired frequency, it is unnecessary to change the setting of the switches SW1, SW2, ..., and SW15 using the control signal 110. However, in the case in which there is a difference between F0 and the desired frequency F1 as shown in FIG. 4 due to, for example, the individual difference of the quartz crystal resonator 26, an adjustment is necessary.

Here, although the oscillation frequency of the oscillator circuit 10 including the variable capacitance circuit 11 according to the present embodiment varies in accordance with the value of the first voltage V1, the characteristic curve (the voltage-oscillation frequency characteristic) corresponds to FKVn (n=0, 3, 6, 9, 12, and 15) shown in FIG. 4. Here, the number n included in the name of the characteristic curve represents how many varicaps are provided with the second voltage V2 among the fifteen varicaps VC1, VC2, ..., and VC15 similarly to FIG. 3. In other words, FKVn in FIG. 4 corresponds to CKVn in FIG. 3 having the value of n in common. It should be noted that FKVn (n=1, 2, 4, 5, 7, 8, 10, 11, 13, and 14) are omitted from display similarly to FIG. 3.

For example, in FKV15 of FIG. 4, since the capacitance values of the fifteen varicaps VC1, VC2, ..., and VC15 are not affected by the variation in the first voltage V1, the combined capacitance value is kept in the reference capacitance value Cst, and the oscillation frequency is also kept in F0 but does not vary. Further, for example, in FKV0 of FIG. 4, all of the capacitance values of the fifteen varicaps VC1, VC2, ..., and VC15 vary in accordance with the value of the first voltage V1. Therefore, the variation in the combined capacitance value becomes the largest, and the variation range in the oscillation frequency is also the largest.

Here, since the combined capacitance value of the variable capacitance circuit 11 varies inevitably including the reference capacitance value Cst irrespective of how the switches SW1, SW2, ..., and SW15 are set, it results that the characteristic curve (the voltage-oscillation frequency characteristic) in FIG. 4 also varies inevitably including F0. Therefore, regarding the oscillator circuit 10 including the variable capacitance circuit 11 according to the present embodiment, the problem that the voltage-oscillation frequency characteristic significantly varies by setting the switches, and it becomes difficult to figure out the variation in the characteristic does not occur. In other words, regarding the variation in FKVn shown in FIG. 4, there is regularity that the center of the variable range of the oscillation frequency is inevitably F0 irrespective of the value of n although the variable range decreases as the value of n increases. Further, by performing the adjustment with reference to F0, a desired frequency can easily be obtained without requiring a complicated procedure. The procedure will specifically be explained using FIG. 4. It should be noted that in the following specific example, the explanation will be presented without regard to FKVn (n=1, 2, 4, 5, 7, 8, 10, 11, 13, and 14) not shown for the sake of convenience of explanation.

Firstly, the difference between the oscillation frequency, which is obtained when setting the first voltage V1 to the maximum voltage value Vmax on the characteristic curve of FKV9, and F0 is smaller than the difference between F1 and F0. Therefore, it is understood that F1 as the desired frequency cannot be obtained in FKV9, FKV12, and FKV15. On the other hand, the difference between the oscillation frequency, which is obtained when setting the first voltage V1 to the maximum voltage value Vmax on the characteristic curve of FKV6, and F0 is larger than the difference between F1 and F0. Therefore, the adjustment to F1 is achievable by using FKV0, FKV3, and FKV6 as the characteristic curve.

In the case in which the characteristic curve is one of FKV0, FKV3, and FKV6, it is possible to adjust the oscillation frequency to F1 by setting the first voltage V1 to Va, Vb, or Vc, respectively. However, the characteristic curve thought to be the most suitable should be selected among these characteristic curves different in adjustment amount from each other. Here, the case in which a minute fluctuation ΔV occurs in the first voltage V1 is considered. The variation ratio (a variation in the oscillation frequency to a variation in the first voltage V1) of the characteristic curve is the highest in FKV0, and the lowest in FKV6. Therefore, it is preferable to select FKV6, in which the oscillation frequency does not significantly deviate from F1 with respect to the minute fluctuation of the first voltage V1, as the characteristic curve. Specifically, in the example shown in FIG. 4, the oscillation frequency is adjusted to F1 by performing the control so as to provide the second voltage V2 to six varicaps out of the fifteen varicaps VC1, VC2, ..., and VC15 using the control signal 110, and setting the first voltage V1 to Vc.

As described above, in the variable capacitance circuit 11 according to the present embodiment, the combined capacitance value of the plurality of variable capacitance elements (the varicaps VC1, VC2, . . . , and VC15) becomes variable including the reference capacitance value Cst. Therefore, the variable capacitance circuit 11 makes it possible to easily adjust a value varying in accordance with a variation in capacitance value. For example, in the oscillator circuit 10 including the variable capacitance circuit 11, the oscillation frequency thereof can easily be adjusted.

Further, although in the present embodiment, the method of adjusting the shift of the oscillation frequency of the oscillator circuit 10 due to the individual difference of the quartz crystal resonator 26 as an example of the oscillation section is described, the variable capacitance circuit 11 described above can also be used for adjustment other than the present embodiment.

Since there occurs no difference between F0 shown in FIG. 4 and the desired frequency F1 if the quartz crystal resonator 26 adjusted in individual difference is used, the variable capacitance circuit 11 described above can be used as an adjusting circuit for the oscillation frequency variable range (frequency variable sensitivity).

By using the variable capacitance circuit 11 described above, in the oscillation frequency of the oscillator circuit 10, the oscillation frequency variable range (the oscillation frequency variable sensitivity) with respect to the variation in the first voltage V1 can be varied taking the second voltage V2 as the base as shown in FIG. 4. Therefore, even in the case of changing the oscillation frequency variable range by changing the voltages to be applied to the plurality of variable capacitance elements (the varicaps VC1, VC2, . . . , and VC15) of the variable capacitance circuit 11 described above, since the oscillation frequency variable range varies taking the second voltage V2 as the base, the adjustment of the oscillation frequency variable range of the oscillator circuit 10 can easily be performed.

2. Vibratory Device

Configuration of Vibratory Device

The vibratory device 200 according to the present embodiment includes the oscillator circuit 10 including the variable capacitance circuit 11, and an oscillator element 230 oscillated by the oscillator circuit 10. As the vibratory device 200, there can be cited, for example, an oscillator equipped with a vibrator as the oscillator element 230 and a physical quantity sensor equipped with a vibratory sensor element 240 as the oscillator element 230.

Figure 5A:
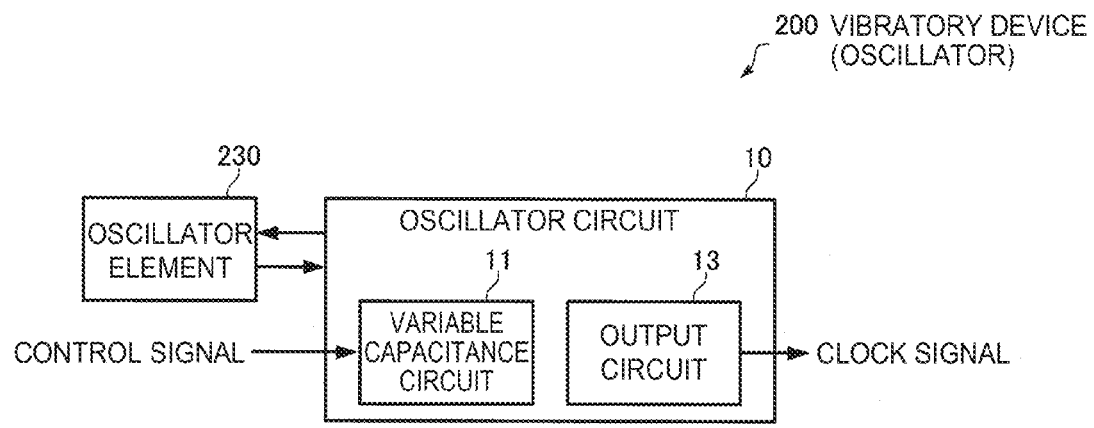
FIGS. 5A and 5B are diagrams each showing a configuration example of the vibratory device.

FIG. 5A shows a configuration example of an oscillator as an example of the vibratory device 200. The vibratory device 200 (the oscillator) shown in FIG. 5A corresponds to the quartz crystal oscillator 20 shown in FIG. 2 in the case of using the quartz crystal resonator 26 as the oscillator element 230. Besides the above, as the oscillator element 230, there can also be used a surface acoustic wave (SAW) resonator, a micro electromechanical systems (MEMS) resonator, a quartz tuning-fork resonator, and so on.

The oscillator circuit 10 oscillates the oscillator element 230 at a constant frequency. Further, the oscillation signal thus obtained is output as a clock signal by the output circuit 13. Here, in the case in which the frequency of the clock signal is different from the desired frequency, the load capacitance of the oscillator circuit 10 is adjusted. Specifically, the setting data of the variable capacitance circuit 11 is changed using the control signal 110 to perform an adjustment so that the desired frequency can be obtained.

Further, by changing the setting data of the variable capacitance circuit 11 using the control signal 110, it is also possible to adjust the frequency variable sensitivity of the oscillator circuit 10 so that the desired sensitivity can be obtained.

The oscillator circuit as the vibratory device 200 according to the present embodiment can also be a voltage-controlled oscillator (e.g., VCXO, VCSO), a temperature-compensated oscillator (TCXO), a voltage-controlled temperature-compensated oscillator (VC-TCXO), an oven controlled oscillator (e.g., OCXO), and so on besides SPXO.

Figure 5B:
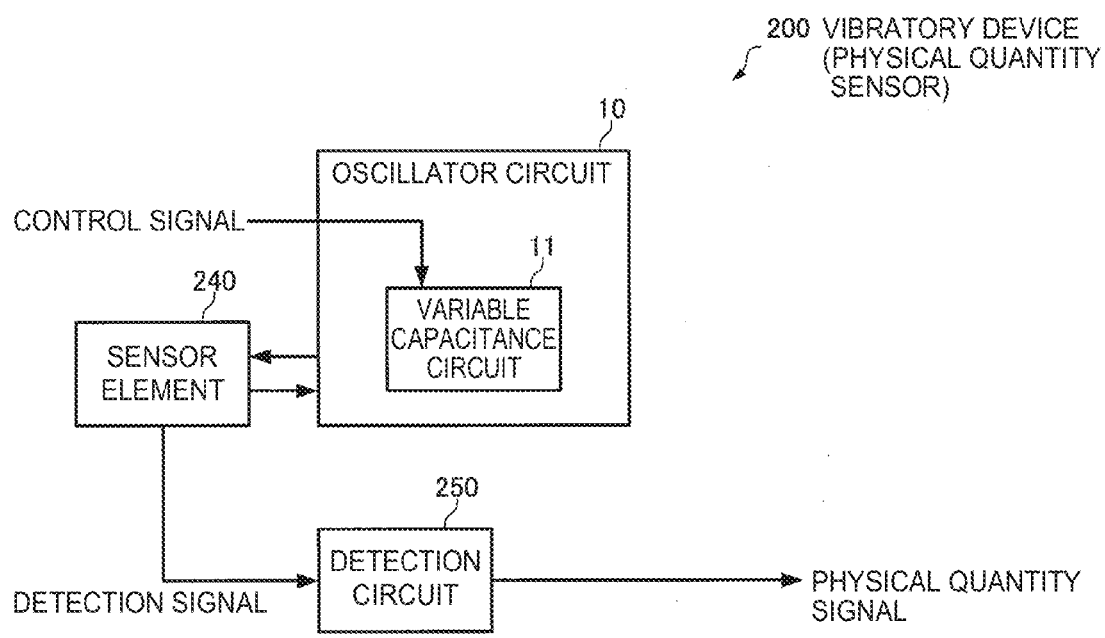

FIG. 5B shows a configuration example of a physical quantity sensor as another example of the vibratory device 200. The vibratory device 200 (the physical quantity sensor) shown in FIG. 5B includes the oscillator circuit 10 including the variable capacitance circuit 11, a sensor element 240 having quartz crystal or the like as a material, and a detector circuit 250.

The oscillator circuit 10 oscillates the sensor element 240 at a constant frequency. On this occasion, in the case in which the oscillation frequency is different from the desired frequency, the setting data of the variable capacitance circuit 11 is changed using the control signal 110 to perform the adjustment so that the desired frequency can be obtained.

The sensor element 240 outputs a detection signal corresponding to an amount of the physical quantity (e.g., angular velocity or an acceleration) applied to the sensor element 240 while vibrating at a constant frequency.

The detector circuit 250 performs detection and rectification of the detection signal of the sensor element 240, and then outputs a physical quantity signal with a signal level corresponding to the amount of the physical quantity applied to the sensor element 240.

As the physical quantity sensor, which is the vibratory device 200, an angular velocity sensor (a gyro sensor), an acceleration sensor, and so on can be cited.

The vibratory device 200 can easily be adjusted in the oscillation frequency since the oscillator circuit 10 includes the variable capacitance circuit 11 as the load capacitance.

Method of Manufacturing Vibratory Device

The vibratory device 200 according to the present embodiment needs to be shipped out after adjusting the variation in oscillation frequency due to, for example, the individual difference of the oscillator element 230. In other words, in the vibratory device 200, the oscillation frequency thereof needs to be adjusted to the desired frequency in manufacturing or shipping. Further, in some cases, the vibratory device 200 is shipped out after performing the adjustment of the oscillation frequency variable range (the oscillation frequency variable sensitivity). In the vibratory device 200 according to the present embodiment, since the oscillator circuit 10 includes the variable capacitance circuit 11 as the load capacitance, by adopting the following manufacturing method, it is possible to select the appropriate setting data to easily adjust the oscillation frequency or the oscillation frequency variable range.

Figure 6:
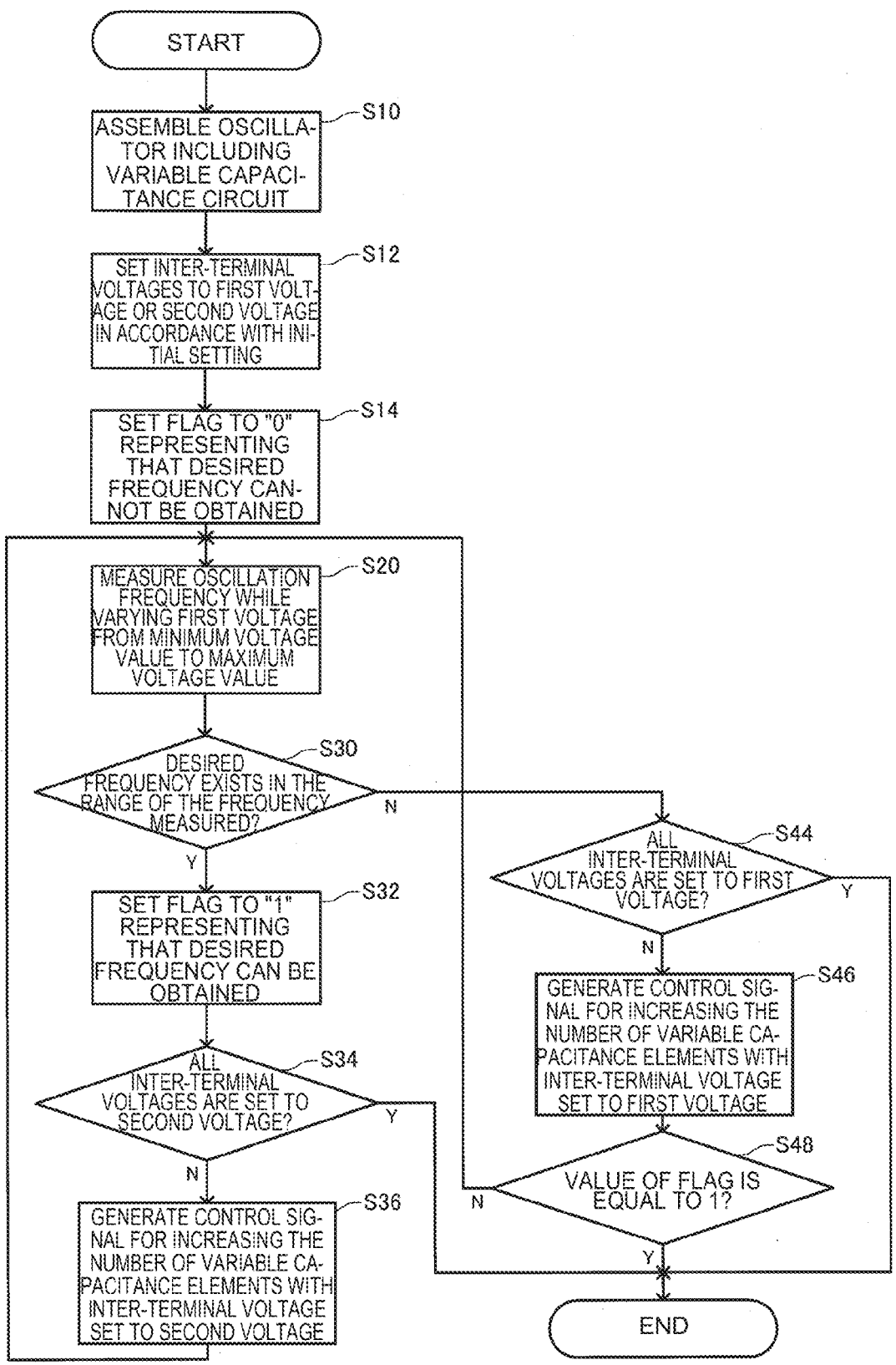
FIG. 6 is a flowchart showing a method of manufacturing the vibratory device.

FIG. 6 is a flowchart showing a manufacturing method for performing the adjustment of the oscillation frequency of the vibratory device 200. It should be noted that in the present example, the explanation will be presented assuming that the vibratory device 200 is the oscillator (see FIG. 5A). Firstly, the oscillator including the variable capacitance circuit 11 is assembled (S10). It is assumed that on this occasion, default setting data corresponding to the voltage levels of the select signals of the switches SW1, SW2, . . . , and SW15 is stored in the storage section ME of the variable capacitance circuit 11 as an initial setting.

Then, the oscillator is powered on, and each of the varicaps VC1, VC2, . . . , and VC15 included in the variable capacitance circuit 11 is provided (S12) with either of the first voltage V1 and the second voltage V2 in accordance with the initial setting. Further, the oscillator includes a flag representing the relationship between the desired frequency and the setting data. The flag is set to 1 in the case in which the desired frequency can be obtained, and is set to 0 in the case in which the desired frequency cannot be obtained. Before performing the adjustment of the oscillation frequency, the flag is set to 0 (S14).

It should be noted that it is also possible that the flag is assigned to, for example, a register of the storage section ME, and can be accessed from the outside of the oscillator. Further, although in the present example, the oscillator includes a plurality of oscillator circuits 10 (see FIG. 2), it is assumed that the setting data in the storage section ME is rewritten simultaneously with the single control signal 110, and the flag is also changed at the same time.

After the step S14, a process of adjusting the oscillation frequency of the vibratory device 200 is started. Firstly, the first voltage V1 is varied from the minimum voltage value Vmin to the maximum voltage value Vmax to measure (S20) the oscillation frequency. By the step S20, the adjustable range of the oscillation frequency in the present setting data is figured out. It should be noted that in the step S20, the voltage does not need to be varied continuously from the minimum voltage value Vmin to the maximum voltage value Vmax, and can also be varied discretely to, for example, the minimum voltage value Vmin, the second voltage V2, and the maximum voltage value Vmax. It should be noted that the oscillation frequency F0 (see FIG. 4) corresponding to the second voltage V2 is common irrespective of the setting data. Therefore, if F0 has already been measured, it is also possible to measure only the oscillation frequencies in the cases in which the first voltage V1 is set to the minimum voltage value Vmin and the maximum voltage value Vmax, respectively.

Then, whether or not the desired frequency is included in the range of the oscillation frequency thus measured is determined (S30). In the case in which the desired frequency can be obtained with the present setting data (Y in S30), the flag is set to 1 (S32). Here, whether or not the present setting data is the data for setting all of the inter-terminal voltages of the varicaps VC1, VC2, . . . , and VC15 to the second voltage V2 is determined (S34). If all of the inter-terminal voltages are the second voltage V2 as the stationary voltage (Y in S34), this is the ideal case in which the oscillation frequency F0 (see FIG. 4) corresponding to the second voltage V2 is equal to the desired frequency F1 (see FIG. 4), and therefore, no further adjustment is required, and a series of processes is terminated.

However, if the present setting data is the data for setting at least one of the inter-terminal voltages of the varicaps VC1, VC2, . . . , and VC15 to the first voltage V1 (N in S34), the setting data is changed using the control signal 110. Specifically, the control signal 110 for increasing the number of varicaps with the inter-terminal voltage set to the second voltage V2 among the varicaps VC1, VC2, . . . , and VC15 is generated (S36), and the process returns to the step S20.

Here, in the case in which the desired frequency cannot be obtained with the present setting data in the step S30 (N in S30), whether or not the present setting data is the data for setting all of the inter-terminal voltages of the varicaps VC1, VC2, . . . , and VC15 to the first voltage V1 is determined (S44). If all of the inter-terminal voltages are the first voltage V1 (Y in S44), this is the case in which the desired frequency cannot be obtained even if the variable range of the oscillation frequency is set to be the largest (see FKV0 in FIG. 4), and therefore, the process terminated abnormally with the flag value kept in 0.

However, if the present setting data is the data for setting at least one of the inter-terminal voltages of the varicaps VC1, VC2, . . . , and VC15 to the second voltage V2 (N in S44), the setting data is changed using the control signal 110. Specifically, the control signal 110 for increasing the number of varicaps with the inter-terminal voltage set to the first voltage V1 among the varicaps VC1, VC2, . . . , and VC15 is generated (S46) to increase the variable range of the oscillation frequency.

Then, whether or not the flag value is 1 is determined (S48). In the case in which the flag value is 0 (N in S48), the process returns to the step S20. In the case in which the flag value is 1 (Y in S48), the previous setting data with which the desired frequency can be obtained is restored by the step S46, and therefore, the process is terminated normally.

It should be noted that in the flowchart showing the method of manufacturing the vibratory device 200 in FIG. 6, the step S20 corresponds to the measuring in the method according to the invention, the step S30 corresponds to the comparing in the method according to the invention, and the steps S36 and S46 correspond to the adjusting in the method according to the invention. It should be noted that in the steps S36 and S46, the control section CT receives the control signal thus generated, and performs the control with the setting data thus rewritten.

First Specific Example

Here, the flowchart shown in FIG. 6 will be explained using the example shown in FIG. 4. In the example shown in FIG. 4, the desired frequency F1 can be obtained by writing the setting data corresponding to FKV6 using the control signal 110, and then providing the first voltage V1 with Vc. Although F1 can be obtained with FKV0 and FKV3 shown in FIG. 4, it is preferable to select FKV6 from the viewpoint of the stability of the oscillation frequency.

Firstly, as the first example, the case in which the default setting data corresponds to FKV9 shown in FIG. 4 will be explained. The oscillator is assembled (S10), and then the characteristic curve of FKV9 shown in FIG. 4 is obtained (S12) in accordance with the initial setting. The flag is set to 0 (S14) representing the fact that the desired frequency F1 cannot be obtained. Then, the first voltage V1 is varied from the minimum voltage value Vmin to the maximum voltage value Vmax to measure (S20) the oscillation frequency. On this occasion, the desired frequency F1 does not exist in the range of the oscillation frequency thus measured (N in S30). Specifically, F1 is higher than the upper limit oscillation frequency adjustable with FKV9.

Further, in the present setting data, the inter-terminal voltages of nine varicaps among the varicaps VC1, VC2, . . . , and VC15 are set to the second voltage V2 (N in S44). Therefore, the control signal 110 for further increasing the number of varicaps with the inter-terminal voltage set to the first voltage V1 among the varicaps VC1, VC2, . . . , and VC15 to increase the variable range of the oscillation frequency is generated (S46). Specifically, the control signal 110 for writing the setting data corresponding to FKV6 shown in FIG. 4 into the storage section ME is generated. On this occasion, since the flag value is 0 (N in S48), the process returns to the step S20.

The oscillation frequency is measured (S20) again while varying the first voltage V1 from the minimum voltage value Vmin to the maximum voltage value Vmax. The setting data is arranged to correspond to FKV6 shown in FIG. 4, and the desired frequency F1 exists within the range of the oscillation frequency thus measured (Y in S30).

Then, the flag is set to 1 (S32), and since it is not true that all of the inter-terminal voltages are set to the second voltage V2 (N in S34), the control signal 110 for increasing the number of the varicaps with the inter-terminal voltage set to the second voltage V2 among the varicaps VC1, VC2, . . . , and VC15 to a number larger than at present is generated (S36). Specifically, the control signal 110 for writing the setting data corresponding to FKV9 shown in FIG. 4 into the storage section ME is generated, and then the process returns to the step S20.

On this occasion, since the setting data is the same as the initial setting (the default setting data), the process similarly proceeds from the step S20 to the step S46 through N in the step S30 and N in the step S44. Specifically, the control signal 110 for writing the setting data corresponding to FKV6 shown in FIG. 4 into the storage section ME is generated.

Here, the flag value is set to 1 (Y in S48), the process is terminated normally in the state in which the setting data corresponding to FKV6 shown in FIG. 4 is written in the storage section ME. Subsequently, by setting the first voltage V1 to Vc, the oscillation frequency can be set to F1.

Second Specific Example

The flowchart shown in FIG. 6 will be explained using another example shown in FIG. 4. In this example, it is assumed that the default setting data corresponds to FKV3 shown in FIG. 4. The oscillator is assembled (S10), and then the characteristic curve of FKV3 shown in FIG. 4 is obtained (S12) in accordance with the initial setting. The flag is set to 0 (S14) representing the fact that the desired frequency F1 cannot be obtained. Then, the first voltage V1 is varied from the minimum voltage value Vmin to the maximum voltage value Vmax to measure (S20) the oscillation frequency. The default setting data is arranged to correspond to FKV3 shown in FIG. 4, and the desired frequency F1 exists within the range of the frequency thus measured (Y in S30).

Then, the flag is set to 1 (S32), and since it is not true that all of the inter-terminal voltages are set to the second voltage V2 (N in S34), the control signal 110 for increasing the number of the varicaps with the inter-terminal voltage set to the second voltage V2 among the varicaps VC1, VC2, . . . , and VC15 to a number larger than at present is generated (S36). Specifically, the control signal 110 for writing the setting data corresponding to FKV6 shown in FIG. 4 into the storage section ME is generated, and then the process returns to the step S20.

The oscillation frequency is measured (S20) again while varying the first voltage V1 from the minimum voltage value Vmin to the maximum voltage value Vmax. The setting data is arranged to correspond to FKV6 shown in FIG. 4, and the desired frequency F1 exists within the range of the oscillation frequencies thus measured (Y in S30).

Then, the flag is set to (overwritten with) 1 (S32), and since it is not true that all of the inter-terminal voltages are set to the second voltage V2 (N in S34), the control signal 110 for increasing the number of the varicaps with the inter-terminal voltage set to the second voltage V2 among the varicaps VC1, VC2, . . . , and VC15 to a number larger than at present is generated (S36). Specifically, the control signal 110 for writing the setting data corresponding to FKV9 shown in FIG. 4 into the storage section ME is generated, and then the process returns to the step S20.

On this occasion, since the setting data is the same as the initial setting (the default setting data) in the first specific example, the process similarly proceeds from the step S20 to the step S46 through N in the step S30 and N in the step S44. Specifically, the control signal 110 for writing the setting data corresponding to FKV6 shown in FIG. 4 into the storage section ME is generated.

Here, the flag value is set to 1 (Y in S48), the process is terminated normally in the state in which the setting data corresponding to FKV6 shown in FIG. 4 is written in the storage section ME. Subsequently, by setting the first voltage V1 to Vc, the oscillation frequency can be set to F1.

As described above, by following the flowchart shown in FIG. 6, the adjustment amount of the combined capacitance value is appropriately varied (i.e., the appropriate setting data is selected) to easily perform the adjustment so that the oscillation frequency becomes the desired frequency. It should be noted that although in the specific examples described above, when changing (steps S36, S46) the number of the varicaps with the inter-terminal voltage set to the first voltage V1 (or the second voltage V2) among the varicaps VC1, VC2, . . . , and VC15, the number is changed by three in accordance with the characteristic curves shown in FIG. 4, the number can also be changed by other numbers (e.g., by one).

Third Specific Example

A manufacturing method for performing the adjustment of the oscillation frequency variable range of the vibratory device 200 will hereinafter be described. It should be noted that in the present example, the explanation will be presented assuming that the vibratory device 200 is the oscillator (see FIG. 5A). Firstly, the oscillator including the variable capacitance circuit 11 is assembled. It is assumed that on this occasion, default setting data corresponding to the voltage levels of the select signals of the switches SW1, SW2, . . . , and SW15 is stored in the storage section ME of the variable capacitance circuit 11 as an initial setting.

Then, the oscillator is powered on, and each of the varicaps VC1, VC2, . . . , and VC15 included in the variable capacitance circuit 11 is provided with either of the first voltage V1 and the second voltage V2 in accordance with the initial setting. On this occasion, it is arranged that at least one of the varicaps is provided with the first voltage. Subsequently, a process of adjusting the oscillation frequency variable range of the vibratory device 200 is started.

Firstly, the first voltage V1 is varied from the minimum voltage value Vmin to the maximum voltage value Vmax to measure the oscillation frequency to thereby figure out the minimum value and the maximum value of the oscillation frequency with the present setting data. It should be noted that on this occasion, the first voltage V1 does not need to be varied continuously from the minimum voltage value Vmin to the maximum voltage value Vmax, and can also be varied discretely to, for example, the minimum voltage value Vmin, the second voltage V2, and the maximum voltage value Vmax. It should be noted that the oscillation frequency F0 (see FIG. 4) corresponding to the second voltage V2 is common irrespective of the setting data. Therefore, if F0 has already been measured, it is also possible to measure only the oscillation frequencies in the cases in which the first voltage V1 is set to the minimum voltage value Vmin and the maximum voltage value Vmax, respectively.

Then, the oscillation frequency variable range is determined based on the oscillation frequencies thus measured, and in the case in which the desired oscillation frequency variable range can be obtained with the present setting data, the content of the storage section ME to which the present setting data is written is not changed.

In the case in which the desired oscillation frequency variable range cannot be obtained, if the present setting data is the data for setting at least one of the inter-terminal voltages of the varicaps VC1, VC2, . . . , and VC15 to the second voltage V2, the setting data is changed using the control signal 110. Specifically, the control signal 110 for setting the inter-terminal voltage of at least one of the varicaps, which have the inter-terminal voltages set to the second voltage V2, to the first voltage V1 is generated, the first voltage V1 is varied from the minimum voltage value Vmin to the maximum voltage value Vmax to measure the minimum value and the maximum value of the oscillation frequency, and the oscillation frequency variable range is determined. In the case in which the desired oscillation frequency variable range can be obtained with the present setting data, the content of the storage section ME in which the present setting data is written is not changed.

The process described above is repeated until the oscillation frequency variable range becomes the desired oscillation frequency variable range, and thus the setting value with which the desired oscillation frequency variable range is obtained is determined as the content of the storage section ME.

Further, if the present setting data is one for setting the inter-terminal voltage of all of the varicaps VC1, VC2, . . . , and VC15 to the first voltage V1, it is the case in which the desired oscillation frequency variable range cannot be obtained, and therefore, the process for adjusting the oscillation frequency variable range is terminated.

3. Electronic Apparatus

An electronic apparatus 300 according to the present embodiment will be explained with reference to FIGS. 7 and 8. It should be noted that the same elements as those shown in FIGS. 1 through 6 are denoted with the same reference numerals and symbols, and the explanation thereof will be omitted.

Figure 7:
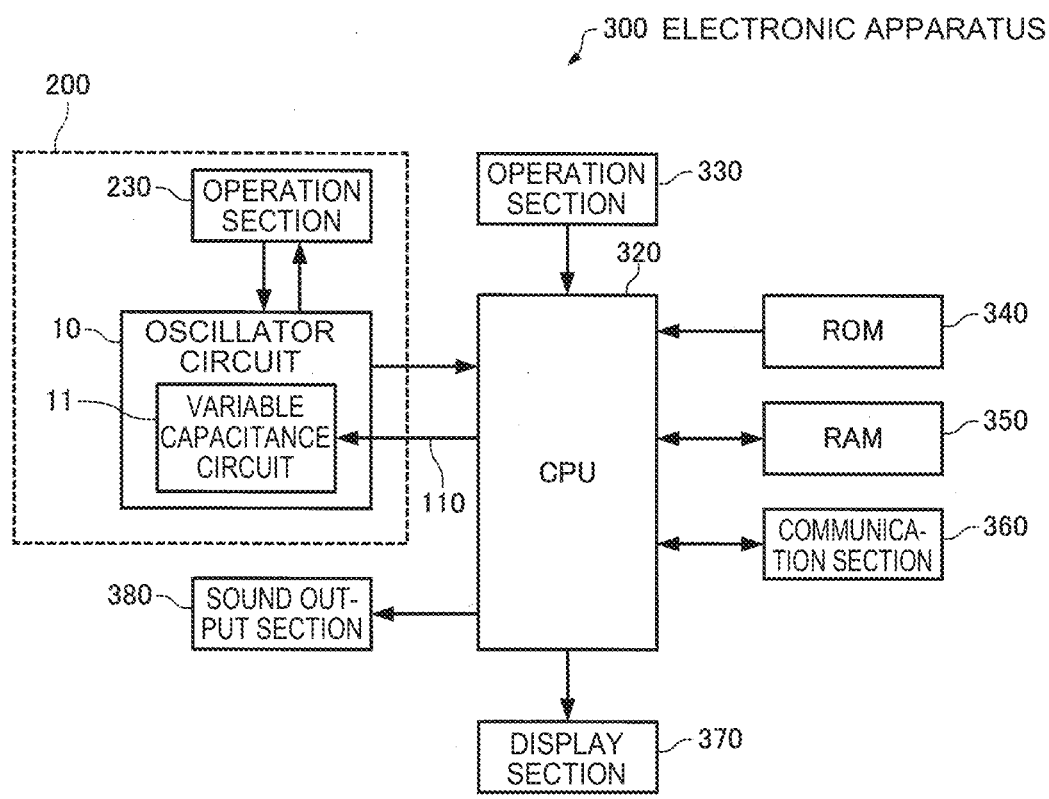
FIG. 7 is a functional block diagram of an electronic apparatus.

FIG. 7 is a functional block diagram of the electronic apparatus 300. The electronic apparatus 300 is configured including the vibratory device 200 including the oscillator circuit 10 and the oscillator element 230 wherein the oscillator circuit 10 includes the variable capacitance circuit 11, a central processing unit (CPU) 320, an operation section 330, a read only memory (ROM) 340, a random access memory (RAM) 350, a communication section 360, a display section 370, and a sound output section 380. It should be noted that the electronic apparatus 300 can also have a configuration obtained by eliminating or modifying some of the constituents (the sections) shown in FIG. 7, or adding another constituent to the configuration described above.

The vibratory device 200 corresponds to the oscillator shown in FIG. 5A. The vibratory device 200 supplies (not shown) not only the CPU 320 but also a variety of sections with the clock signal from the oscillator circuit 10 including the variable capacitance circuit 11.

The CPU 320 performs a variety of arithmetic processes and control processes using the clock signal output by the vibratory device 200 in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, a process of making the sound output section 380 output a variety of sounds, and so on.

The operation section 330 is an input device including operation keys, button switches, and so on, and outputs the operation signal corresponding to the operation by the user to the CPU 320.

The ROM 340 stores a program, data, and so on for the CPU 320 to perform a variety of arithmetic processes and control processes.

The RAM 350 is used as a working area of the CPU 320, and temporarily stores, for example, the program and data retrieved from the ROM 340, the data input from the operation section 330, and the calculation result obtained by the CPU 320 performing operations in accordance with the various programs.

The communication section 360 performs a variety of control processes for achieving the data communication between the CPU 320 and the external devices.

The display section 370 is a display device formed of a liquid crystal display (LCD) or the like, and displays a variety of information based on the display signal input from the CPU 320.

Further, the sound output section 380 is a device, such as a speaker, for outputting sounds.

In the electronic apparatus 300, it is possible for the CPU 320 to adjust the setting data of the variable capacitance circuit 11 included in the oscillator circuit 10 using the control signal 110. Therefore, even if a shift should occur in the oscillation frequency of the clock signal, the adjustment can easily be performed.

As the electronic apparatus 300, a variety of devices are possible. There can be cited, for example, a network server, a personal computer (e.g., a mobile type personal computer, a laptop personal computer, and a tablet personal computer), a mobile terminal such as a cellular phone, a digital still camera, an inkjet ejection device (e.g., an inkjet printer), a storage area network apparatus such as a router or a switch, a local area network apparatus, a television set, a video camera, a video recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Figure 8:
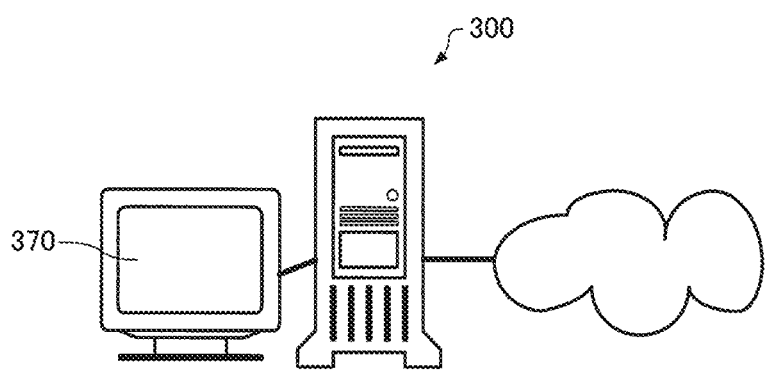
FIG. 8 is a diagram showing an example of an appearance of the electronic apparatus.

FIG. 8 is a diagram showing an example of an appearance of a network server as an example of the electronic apparatus 300. The network server as the electronic apparatus 300 is provided with an LCD as the display section 370. Further, in the network server as the electronic apparatus 300, the setting data of the variable capacitance circuit 11 included in the oscillator circuit 10 can be adjusted using the control signal 110. Therefore, even if a shift should occur in the oscillation frequency of the clock signal, the adjustment can easily be performed. As a result, the accurate clock signal can be used, and therefore, the reliability is enhanced.

4. Moving Object

A moving object 400 according to the present embodiment will be explained with reference to FIG. 9.

Figure 9:
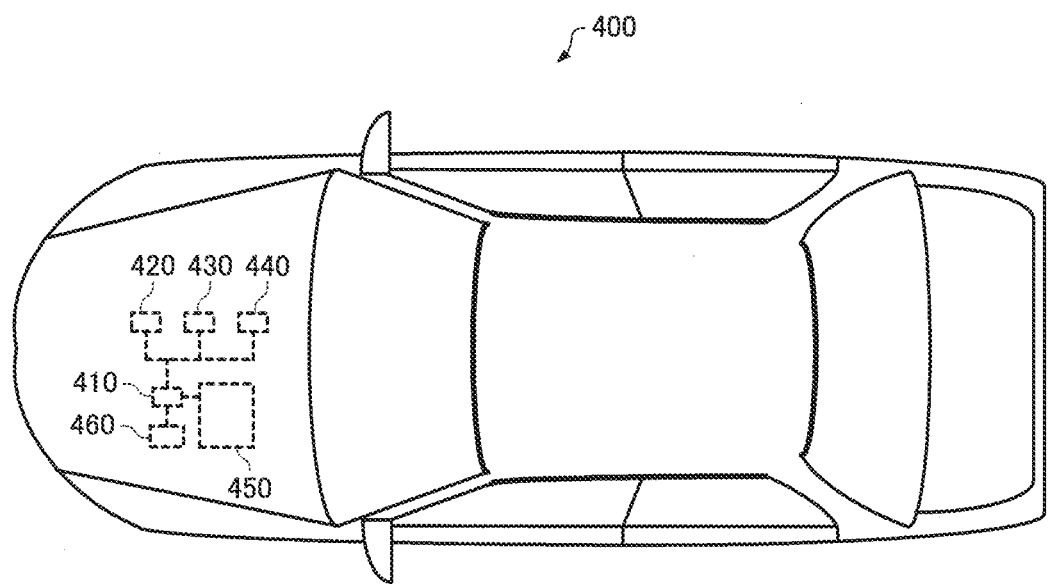
FIG. 9 is a diagram showing an example of a moving object.

FIG. 9 is a diagram (a top view) showing an example of the moving object 400 according to the present embodiment. The moving object 400 shown in FIG. 9 is configured including an oscillator section 410, controllers 420, 430, and 440 for performing a variety of types of control such as an engine system, a brake system, or a keyless entry system, a battery 450, and a backup battery 460. It should be noted that the moving object 400 according to the present embodiment can have a configuration obtained by eliminating or modifying some of the constituents (sections) shown in FIG. 9, or adding another constituent thereto.

The oscillation section 410 corresponds to the vibratory device 200 (the oscillator) including the oscillator circuit 10. The oscillator circuit 10 includes the variable capacitance circuit 11. Here, the system of the moving object 400 receives the clock signal from the oscillation section 410, namely the vibratory device 200 (the oscillator) including the oscillator circuit 10. Further, since the variable capacitance circuit 11 is included, even if a shift should occur in the oscillation frequency of the clock signal, the adjustment can easily be performed. Therefore, in the system of the moving object 400, the accurate clock signal can be used, and therefore, the reliability is enhanced.

It should be noted that as such a moving object 400, a variety of types can be adopted, and a vehicle (including an electric vehicle), an aircraft such a jet plane or a helicopter, a ship, a rocket, an artificial satellite, and so on can be cited.

5. Other Issues

The invention includes configurations (e.g., configurations having the same function, the same way, and the same result, or configurations having the same object and the same advantage) substantially the same as the configuration described in the embodiment described above. Further, the invention includes configurations obtained by replacing a non-essential part of the configuration described as the embodiment. Further, the invention includes configurations providing the same functions and the same advantage, or configurations capable of achieving the same object, as the configuration described as the embodiment. Further, the invention includes configurations obtained by adding a known technology to the configuration described as the embodiment.

The entire disclosure of Japanese Patent Application No. 2013-123126, filed Jun. 11, 2013 is expressly incorporated by reference herein.

What is claimed is:

1. A variable capacitance circuit comprising:
a plurality of variable capacitance elements each having a capacitance value controlled by an inter-terminal voltage applied between terminals of the variable capacitance element, and connected in parallel to each other; and
a control section adapted to control the inter-terminal voltage of each of the plurality of variable capacitance elements, wherein:
a variable characteristic of a combined capacitance value of the plurality of variable capacitance elements becomes variable taking a predetermined capacitance value as a base,
the inter-terminal voltage of at least one of the plurality of variable capacitance elements is set to a first voltage as a variable voltage,
the inter-terminal voltage of the rest of the plurality of variable capacitance elements is set to a second voltage as a stationary voltage,
the second voltage takes a voltage higher than a minimum voltage value of the variable voltage and lower than a maximum voltage value of the variable voltage,
the control section controls the inter-terminal voltage of each of the plurality of variable capacitance elements to be set to one of the first voltage and the second voltage, and
the control section includes a switch adapted to exclusively select one of the first voltage and the second voltage.

2. The variable capacitance circuit according to claim 1, wherein
the predetermined capacitance value is the combined capacitance value obtained when setting the inter-terminal voltages of all of the plurality of variable capacitance elements to the second voltage.

3. The variable capacitance circuit according to claim 1, wherein
the control section includes a storage section storing data for setting the inter-terminal voltage of each of the plurality of variable capacitance elements to one of the first voltage and the second voltage.

4. The variable capacitance circuit according to claim 1, wherein
the control section controls the inter-terminal voltage of each of the plurality of variable capacitance elements to be set to one of the first voltage and the second voltage based on a control signal input to the control section.

5. An oscillator circuit adapted to oscillate an oscillation section to generate an oscillation signal, comprising:
the variable capacitance circuit according to claim 1 as a load capacitance.

6. A vibratory device comprising:
the oscillator circuit according to claim 5; and
the oscillation section.

7. An electronic apparatus comprising:
the variable capacitance circuit according to claim 1.

8. A moving object comprising:
the variable capacitance circuit according to claim 1.

9. A method of manufacturing a vibratory device including:
an oscillation section,
a variable capacitance circuit including a plurality of variable capacitance elements each having a capacitance value controlled by an inter-terminal voltage applied between terminals of the variable capacitance element, and connected in parallel to each other, setting the inter-terminal voltage of at least one of the plurality of variable capacitance elements to a first voltage as a variable voltage while setting the inter-terminal voltage of the rest of the plurality of variable capacitance elements to a second voltage as a stationary voltage, and making a variable characteristic of a combined capacitance value of the plurality of variable capacitance elements variable taking a predetermined capacitance value as a base,
a control section adapted to control the inter-terminal voltage of each of the plurality of variable capacitance elements to be set to one of the first voltage and the second voltage, and
an oscillator circuit having the variable capacitance circuit electrically connected to the oscillator circuit, and adapted to oscillate the oscillation section to generate an oscillation signal,
the method comprising:
measuring a frequency of the oscillation signal with the first voltage varied;
comparing a reference frequency and the frequency measured in the measurement step with each other; and
controlling, by the control section, the inter-terminal voltage based on a result in the comparing step, wherein the second voltage takes a voltage higher than a minimum voltage value of the variable voltage and lower than a maximum voltage value of the variable voltage.

* * * * *